United States Patent [19]

Kanemaru

[11] Patent Number: 5,280,438
[45] Date of Patent: Jan. 18, 1994

[54] MEMORY CIRCUIT INCLUDING AN EEPROM PROVIDED WITH UNIQUE ADDRESSING MEANS FOR STORING AT SELECTED MEMORY CELLS FREQUENTLY INCREMENTED COUNT DATA

[75] Inventor: Kenji Kanemaru, Toyota, Japan

[73] Assignee: Nippondenso Co., Ltd., Kariya, Japan

[21] Appl. No.: 846,959

[22] Filed: Mar. 6, 1992

Related U.S. Application Data

[63] Continuation of Ser. No. 358,791, May 30, 1989, Pat. No. 5,095,452.

[30] Foreign Application Priority Data

May 30, 1988 [JP] Japan ................. 63-131957
Jun. 9, 1988 [JP] Japan ................. 63-142633
Jun. 14, 1988 [JP] Japan ................. 63-146612

[51] Int. Cl.$^5$ ............................................. G06F 15/20
[52] U.S. Cl. ........................................ 364/561; 377/50
[58] Field of Search .................. 235/95R; 364/561; 377/24.1, 26, 50

[56] References Cited

U.S. PATENT DOCUMENTS

| | | | |
|---|---|---|---|
| 3,585,376 | 6/1971 | Toscano | 318/632 X |
| 3,609,308 | 9/1971 | Lemon et al. | 364/561 X |
| 3,705,295 | 12/1972 | Betz | 377/50 |
| 3,737,633 | 6/1973 | Collineau | 377/50 |
| 3,845,281 | 10/1974 | Konisi et al. | 377/50 |
| 3,858,033 | 12/1974 | Esch | 377/50 |
| 3,947,664 | 3/1976 | Cox et al. | 377/50 X |
| 3,978,727 | 9/1976 | Griverus | 377/50 |
| 4,125,295 | 11/1978 | Ruhnau et al. | 377/54 X |
| 4,162,443 | 7/1979 | Brearley et al. | 324/780 |
| 4,514,813 | 4/1985 | Nozawa et al. | 364/474.35 |
| 4,519,969 | 5/1986 | Bloom et al. | 364/183 |
| 4,638,457 | 1/1987 | Schrenk | 377/24.1 X |
| 4,682,287 | 7/1987 | Mizuno et al. | 364/561 |
| 4,718,168 | 1/1988 | Kerr | 324/206 X |
| 4,750,104 | 6/1988 | Kumamoto et al. | 318/632 X |
| 4,803,707 | 2/1989 | Cordan, Jr. | 377/26 X |
| 5,095,452 | 3/1992 | Kanemaru | 377/50 X |

FOREIGN PATENT DOCUMENTS

55-4247 1/1980 Japan .

OTHER PUBLICATIONS

Journal of Nippondenso Technical Disclosure 47-092, published May 15, 1986 (English translation).
Journal of Nippondenso Technical Disclosure 43-088, published Sep. 15, 1985 (English translation).

Primary Examiner—Edward R. Cosimano
Attorney, Agent, or Firm—Cushman, Darby & Cushman

[57] ABSTRACT

A counter is provided which updates a most-recent counter value to be stored in a non-volatile memory. The counter includes a counter circuit for receiving a series of count pulses defining a count operation and outputting a series of coded binary signals in response thereto. Each one of the series of coded binary signals includes at least first digit data and second digit data. A selecting circuit is coupled to the non-volatile memory and the counter circuit for logically selecting, in response to each respective second digit data, a first select memory cell in the non-volatile memory for which the corresponding first digit data is to be stored. A write control circuit is coupled to the non-volatile memory and the counter circuit for writing a subsequent first digit data over the first select memory cell when a counting operation of the respective digit value has not reached completion, and writing the subsequent first digit data in a different memory cell when a counting operation of the respective digit value has reached completion.

3 Claims, 14 Drawing Sheets

Fig. 3

| PULSE NUMBER | VALUE OF EACH DIGIT / DIGIT (mile) | 0 | 1 | 2 | 3 | 4 | 5 | 6 | 7 | 8 | 9 | 0 | COUNTED VALUE |
|---|---|---|---|---|---|---|---|---|---|---|---|---|---|
| 637 PULSE/km ⇨ 1025,152128... PULSE/mile | 0.1 | O | | | | | O | | O^A | | | | 102 (103) |
| | 1 | | | O^C | O^B | O^D | | | | | | | 1025 (1026) |
| | 10 | | | | | | | | | O^E | O^F | | 1025 (1026) |
| | 100 | | | | | | | | | | | O^G O | 1025 (1026) |

| PULSE NUMBER | DIGIT (mile) | VALUE OF THE DIGIT | 0→1→2→3→4→5→6→7→8→9→0 | | | | | | | | | | | COUNTED VALUE |
|---|---|---|---|---|---|---|---|---|---|---|---|---|---|---|
| 2548 PULSES/Km ⇨ 4100.608512... PULSES/mile | 0.1 | | | | | | | | | | | S1 | | 410 |
| | 1 | | | O | | O | | O | | O | | S2 | | 4100 (4101) |
| | 10 | | | | | | | | O | O | O | S3 | | 4100 |
| | 100 | | O | O | O | O | O | O | O | O | O | O | | 4100 (4101) |

↑P

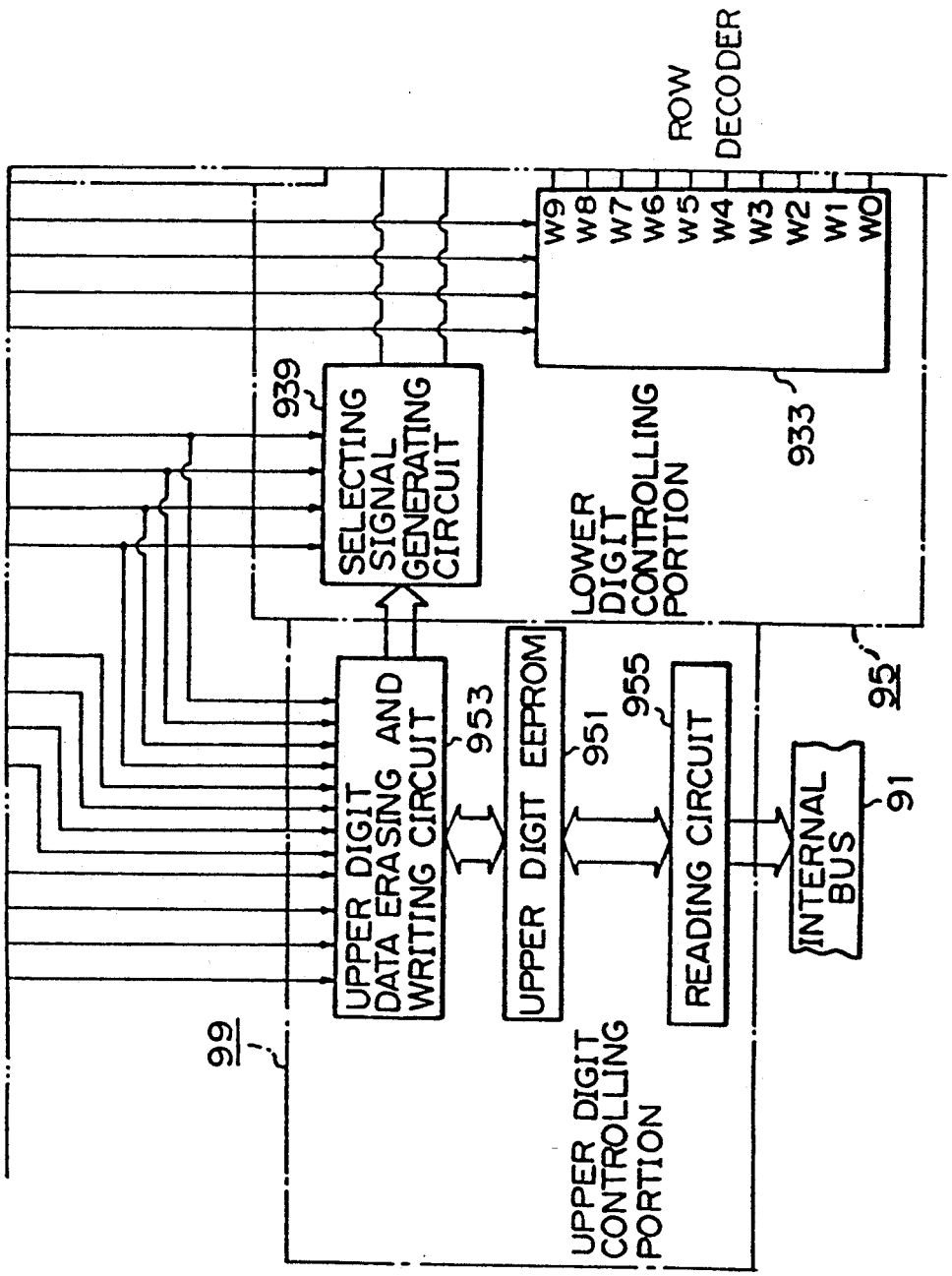

Fig. 10 A

| CODE / DECIMAL | $2^3$ | $2^2$ | $2^1$ | $2^0$ | ERASING AND WRITING |
|---|---|---|---|---|---|
| 0 | 0 | 0 | 0 | 0 | ERASING |
| 1 | 0 | 0 | 0 | 1 | [0001] WRITING |
| 2 | 0 | 0 | 1 | 1 | [0010] WRITING |
| 3 | 0 | 1 | 1 | 1 | [0100] WRITING |
| 4 | 0 | 1 | 0 | 0 | [0100] WRITING AFTER ERASING |
| 5 | 1 | 1 | 0 | 0 | [1000] WRITING |
| 6 | 1 | 1 | 0 | 1 | [0001] WRITING |
| 7 | 1 | 0 | 0 | 0 | [1000] WRITING AFTER ERASING |
| 8 | 1 | 0 | 0 | 1 | [0001] WRITING |
| 9 | 1 | 0 | 1 | 1 | [0010] WRITING |
| 10 | 1 | 1 | 1 | 1 | [0100] WRITING |
| WRITING FREQUENCY | 2 | 3 | 2 | 3 | ERASING FREQUENCY 3 TIMES |

Fig. 10 B

| CODE / DECIMAL | $2^3$ | $2^2$ | $2^1$ | $2^0$ | ERASING AND WRITING |
|---|---|---|---|---|---|
| 0 | 0 | 0 | 0 | 0 | ERASING |
| 1 | 0 | 0 | 0 | 1 | [0001] WRITING |
| 2 | 0 | 0 | 1 | 1 | [0010] WRITING |
| 3 | 0 | 1 | 1 | 1 | [0100] WRITING |
| 4 | 1 | 0 | 0 | 0 | [1000] WRITING AFTER ERASING |
| 5 | 1 | 0 | 0 | 1 | [0001] WRITING |
| 6 | 1 | 0 | 1 | 1 | [0010] WRITING |
| 7 | 0 | 1 | 0 | 0 | [0100] WRITING AFTER ERASING |
| 8 | 1 | 1 | 0 | 0 | [1000] WRITING |
| 9 | 1 | 1 | 0 | 1 | [0001] WRITING |
| 10 | 1 | 1 | 1 | 1 | [0010] WRITING |
| WRITING FREQUENCY | 2 | 2 | 3 | 3 | ERASING FREQUENCY 3 TIMES | n = 223

MEMORY CIRCUIT INCLUDING AN EEPROM PROVIDED WITH UNIQUE ADDRESSING MEANS FOR STORING AT SELECTED MEMORY CELLS FREQUENTLY INCREMENTED COUNT DATA

This is a continuation of application No. 07/358,791, filed May 30, 1989 now U.S. Pat. No. 5,095,452.

BACKGROUND OF THE INVENTION

1. Field of the Invention

The present invention relates to a non-volatile counter, and more precisely, relates to a non-volatile counter in which data is stored in erasable and writable semiconductor non-volatile memory devices.

2. Description of the Related Art

A non-volatile counter in which a counter circuit for counting pulses and a non-volatile memory device such as EEPROM or the like are arranged in parallel to each other, wherein when the value of the counter is changed that value is written in the EEPROM, is well known.

The non-volatile counter can be used as an electronic trip meter of a car or a data collecting device in a plant or the like as it can hold data in the memory after the electric power supply thereto is shut off.

The non-volatile counter provided with the non-volatile memory device such as EEPROM or the like, however, has a problem in that a maximum counting value to be counted is necessarily restricted to a certain value, due to a limitation of the number erasing and writing operations of the EEPROM. Note, since the EEPROM has an endurance characteristic, the number of the erasing and writing operations thereof is naturally limited; for example, when a binary counter is used, the number of changes of data is largest in the least significant bit (LSB), and thus the upper limit of the counting value is inherently decided by the capacity to change the number of data per unit time in the least significant bit (LSB).

Further, when a deficit arises in a memory cell and when the bit in which the deficit arises is a higher digit, the data obtained therefrom is completely different to the correct data.

To overcome these problems, a counter in which a plurality of memory cells for memorizing the count value, especially in a lower digit, is provided in the EEPROM, and the count values for the lower digit are sequentially written in one of the memory cells in turn, to thereby improve the upper limitation of the count value, has been proposed, or a counter in which the same counted values are stored in a plurality of the memory cells and one data thereof is selected therefrom by applying a majority logic thereto, to thereby improve a reliability thereof, also has been proposed.

Even when these counters are used, however, the problems above are not necessarily completely resolved.

Note, when these counters are used, other problems arise in that the number of the cells is naturally increased, and moreover, a monitoring operation for checking a number of writing operations of the memory cells or an operation for processing a majority logic to check the reliability of the cells, must be carried out separately.

Further, when performing these operations, a micro-computer for controlling these operations is usually required, to thereby make the construction of the cells complicated, and accordingly, the reliability thereof will be lost.

Further, in this case, when the micro-computer malfunctions, it becomes difficult to read the count value.

Therefore, to overcome these problems, the present invention provides a non-volatile counter having a simple construction which can improve the upper limitation for the counting value, and further, improve the reliability of the memorized counting value.

To attain the above object of the present invention, there is provided a non-volatile counter which updates data stored in erasable and writable non-volatile memory devices based on count data and performs a counting operation, said memory devices being arranged as an array of cells having a predetermined number of bits, wherein said counter is provided with a selecting means for selecting a cell corresponding to a value of a predetermined digit of said count from said cell array and a writing means for writing data corresponding to the value of a digit different from said predetermined digit in said selected cell.

3. Mode of operation

The non-volatile counter used in the present invention carries out a counting operation by updating the data stored in the cell array having a predetermined bit number and forming an erasable and writable non-volatile memory device, based on count data.

Note, in the present invention, a cell corresponding to a value of the predetermined digit of said count from said cell array is selected by the selecting means and data corresponding to the value of a digit different from said predetermined digit is written in the selected cell by the writing means.

Namely, in the present invention, a plurality of cells are not simply provided in the non-volatile memory device for storing the count value but are arranged in a cell array, and thus a specific cell in the cell array can be designated by a value of a predetermined digit of the count value.

Therefore, the number of writing operations for writing data and the erasing operation for erasing same from each of the cells, can be reduced in proportion to the number of cells arranged in the cell array, and further, each cell can carry not only a value of a certain digit which the cell has memorized but also a value of a certain digit with respect to a position thereof in the cell array.

4. Effect of the Invention

According to the non-volatile counter used in this invention, cells comprising an array of a predetermined number of bits, constituting a volatile memory, are selected according to the predetermined digits of the count and data corresponding to the value of another digit is written in the cell, so the numbers of the erasing and writing operations per cell can be remarkably reduced at the lower digits of the conventional simple counter, and thus a superior and improved reliability of the count to be stored is obtained.

Further, each cell comprising the non-volatile memory carries not only information on the value of a certain digit stored by the cell but also information on the value of a predetermined digit obtained by the position of the cell in the array, so the volume of the information stored can be increased compared to the case wherein a plurality of cells is used.

BRIEF DESCRIPTION OF THE DRAWINGS

FIG. 3 is a table of the timing of adjustment of the pulse counting operation;

FIG. 8 is a table illustrating another example of the timing of adjustment of the pulse counting operation;

FIGS. 9A, 9B, 9C and 9D collectively show one embodiment of a counter used in this invention showing a non-volatile memory counter;

FIGS. 10(A) and 10(B) show a code system used with the counter shown in FIG. 9;

DESCRIPTION OF THE PREFERRED EMBODIMENTS

The present invention will be explained with reference to a digital odometer for an automobile.

Figure 1:
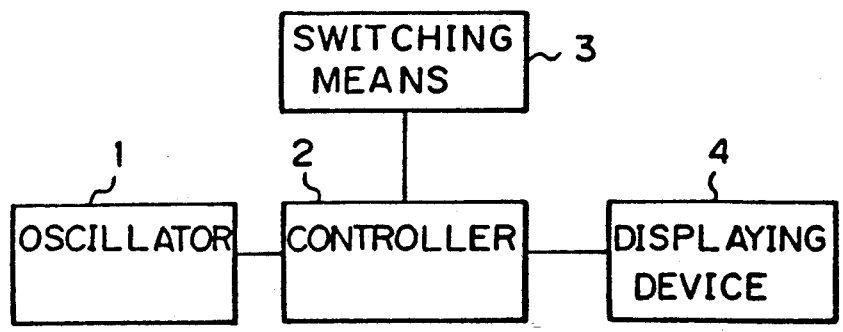
FIG. 1 is a schematic diagram of an odometer of an automobile to which the present invention is applied.

FIG. 1 is a block diagram schematically showing a digital odometer for an automobile. In FIG. 1, 1 is a reference pulse generator, mounted on, for example, a gear of a wheel of an automobile, which generates a pulse (reference pulse) at every rotation of the wheel. The generator 1 is set to generate 637 pulses per kilometer running.

Reference 2 is a control device which calculates the running distance of the automobile in either units of kilometers or units of miles by counting the clock pulses from the reference pulse generator 1. Reference numeral 3 is a switching means provided on the control device 2 for switching the processing operation in the control device 2 between the units of kilometers for automobiles used in Japan and units of miles for automobiles used in the U.S. Reference numeral 4 is a display device which displays the running distance of the automobile on a panel provided inside the automobile cabin in accordance with the state of the switching means 3.

Figure 2:
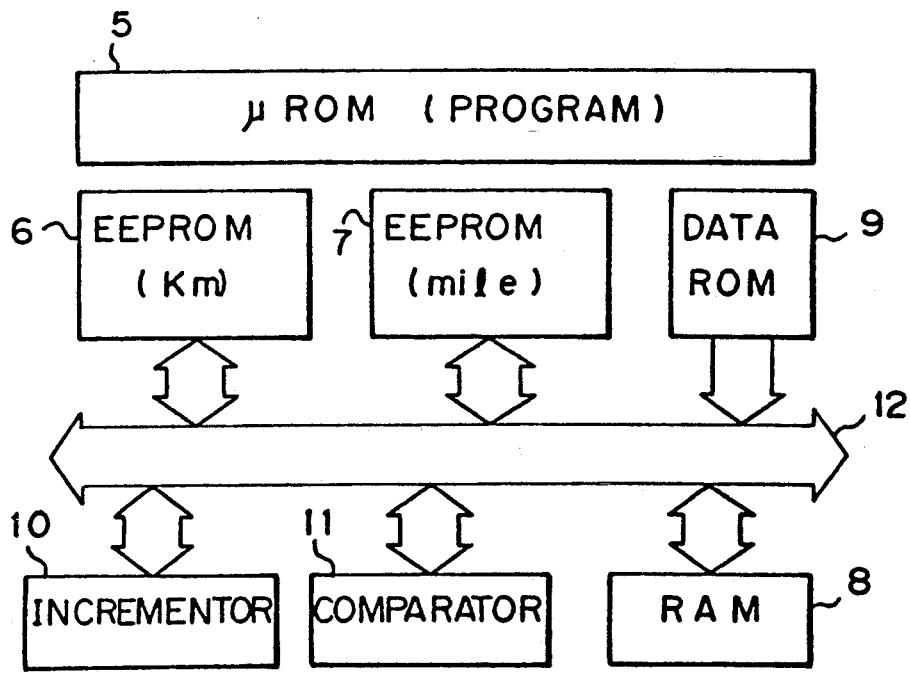
FIG. 2 is a block diagram of an IC circuit used in a control means shown in FIG. 1.

FIG. 2 is a block diagram of an IC circuit used inside the control device 2 shown in FIG. 1.

In FIG. 2, reference numeral 5 is a μROM including a control program for commanding the transfer of data. Reference numeral 6 is a kilometer display EEPROM which stores the running distance of the automobile in units of kilometers. Reference numeral 7 is a mile display EEPROM in which is stored the running distance in units of miles. The value of the EEPROMs 6 and 7 can be selectively displayed on the display panel inside the automobile cabin by the display device 4. In this invention, a RAM may be used instead of using the EEPROMs.

Reference numeral 8 is, a RAM for storing a count of the clock pulses generated from the generator 1, 9 is a data ROM for previously storing a predetermined mile display and a predetermined count of the clock pulses, 10 is an incrementor, 11 is a comparator, and 12 is an internal bus.

The basic principle for adding the running distance used in this invention will now be explained. As explained above, the generator 1, which generates one reference pulse corresponding to a length of one rotation of a wheel of an automobile, i.e., the first physical measure, generates exactly 637 pulses per kilometer. The technology for displaying the running distance in units of kilometers from the reference signal pulses is well known, so the explanation thereof will be omitted.

When it is judged necessary from the state of the switching device 3 to display the distance in miles, as mentioned earlier, it is sufficient to convert it using about 1025.152128 pulses as 1 mile (corresponding to the second physical measure defined in this invention and a physical measure not a whole multiple of the reference signal pulses).

However, counting reference clock pulses in decimal fractions requires a complexed processing operation and additional new memories, so is disadvantageous.

On the other hand, if one adds one mile at every 1025 reference pulses, as the running distance increases, the value displayed will gradually become larger than the actual running distance, so the problem arises that the accuracy will increasingly deteriorate. For example, in such a system, when 10250 pulses are counted, 10 miles will be displayed, i.e., there will be an error of one pulse with respect to respect to 10,251 pulses.

In the embodiment of this invention, to overcome this problem, the count of the clock pulses is adjusted just once at some one point before 10 miles' running, whereby the actual number of clock pulses is made 10,251, though only 10,250 pulses were really counted. Therefore, the accuracy can be improved. This operation is repeated with every 10 miles' running by a suitable program.

Even performing such an operation every 10 miles, the system displays 100 miles when 102,510 pulses are counted, so even in this case, the 100 miles is displayed 5 pulses earlier than when an actual 102,515 pulses are counted.

Accordingly, it is advantageous to adjust the count by five pulses before each 100 miles is reached. That is, assuming that 1025.152128 pulses correspond to 1 mile and using as the approximate number of pulses the uppermost four digits of the same, i.e., 1025, it is sufficient to make adjustments for the value 0.152128, below the decimal point, the same number of times as the figures of each digit at a suitable timing.

The basic idea behind this timing is that, if the digits following the lowest digit of the approximate number of pulses 1025 is the l th digit (l is a natural number) lower than the lowest digit, adjustment of the counting of the clock pulses the same number of times as the figures of each digit before $1025 \times 10^l$ pulses are counted, would enable suppression of the conversion error to mile units to an extremely small level. (Note that, in this embodiment, "adjustment" means to count extra clock pulses).

For example, even by making adjustment to only up to the third digit displayed (up to 1000 mile) and without making any adjustment to the fourth digit on, the display error over the true value after even one million miles is less than 0.2 mile.

Accordingly, in the present invention, a quite practical value for indicating the actual running distance can be obtained.

On the other hand, the information indicating when such adjustment should be carried out is stored in a predetermined address of a data ROM 9. One example of the timing is indicated in (a) of FIG. 3. Note that (a) represents a timing table indicating the times at which an adjusting operation takes place.

FIG. 3 is a two-dimensional map and shows the state of storage in the data ROM 9 of display data to be adjusted.

The vertical column shows the digits corresponding to the current displayed value (units of mile) (with 0.1 mile as the lowest digit).

The horizontal row shows the value of change of the current displayed values corresponding to each digit.

In FIG. 3, circles C, D, E, F, and G are given to certain addresses of the table. Adjustment is performed when the current displayed value moves to those addresses. At portions with no circles, the usual operation goes on and the display value is changed at every 1025 pulses counted.

Each of circles C through G represent a time at which the adjustment should be carried out for the 10 mile digit. Thus, when the 10 mile digit changes from 1 to 2 as shown by reference C in FIG. 3, the adjustment takes place, and the 10 mile digit number is changed from 1 to 2 after 1026 pulses have been counted. Other circles D-G in FIG. 3 represent similar timings.

On the other hand, regarding to the digits below the decimal point, normally, the display value is changed at every 102 pulses counted, but in circle mark portions, the display value is changed at every 103 pulses.

For example, supporting that the current displayed value is 244.6 miles. When this value is about to change to 244.7, adjustment is made since a circle is stored at the address A in the horizontal column of FIG. 3 for the 0.1 mile digits.

As explained above, in this situation, the current displayed value is changed to 244.7 after 103 pulses are counted.

Suppose that the current displayed value is 243.9. When this value is about to change to 244.0, adjustment will be carried out because a circle is stored in the address B in the horizontal column in FIG. 3 of the 1 mile digit. In this situation, the current displayed value is changed to 244.0 after 1026 pulses are counted.

The portion (b) of FIG. 3 shows the stored values for the count of clock pulses in the RAM 8 when the current displayed value is changed. The parenthesized numerals shows the actual number of output pulses of when the adjustment is carried out.

The accuracy can be improved by uniformly dispersing the adjustments at equal intervals, but it is also possible not to specify any particular locations and set them by random numbers.

It is preferable that the storage addresses of the digits of the display data to be adjusted should be kept from overlapping as much as possible.

In this invention, when the current displayed value is changed, the timing of this is based upon the time when the value of the lowest digit of the current displayed value changes from the predetermined value to a successive value. However, it is preferable that the change from the predetermined value to the successive value be from 9 to 0.

The operation of this invention will be explained with reference to the flow chart shown in FIG. 4.

Note that all the following processing steps are previously stored in the μROM 5.

Figure 4:
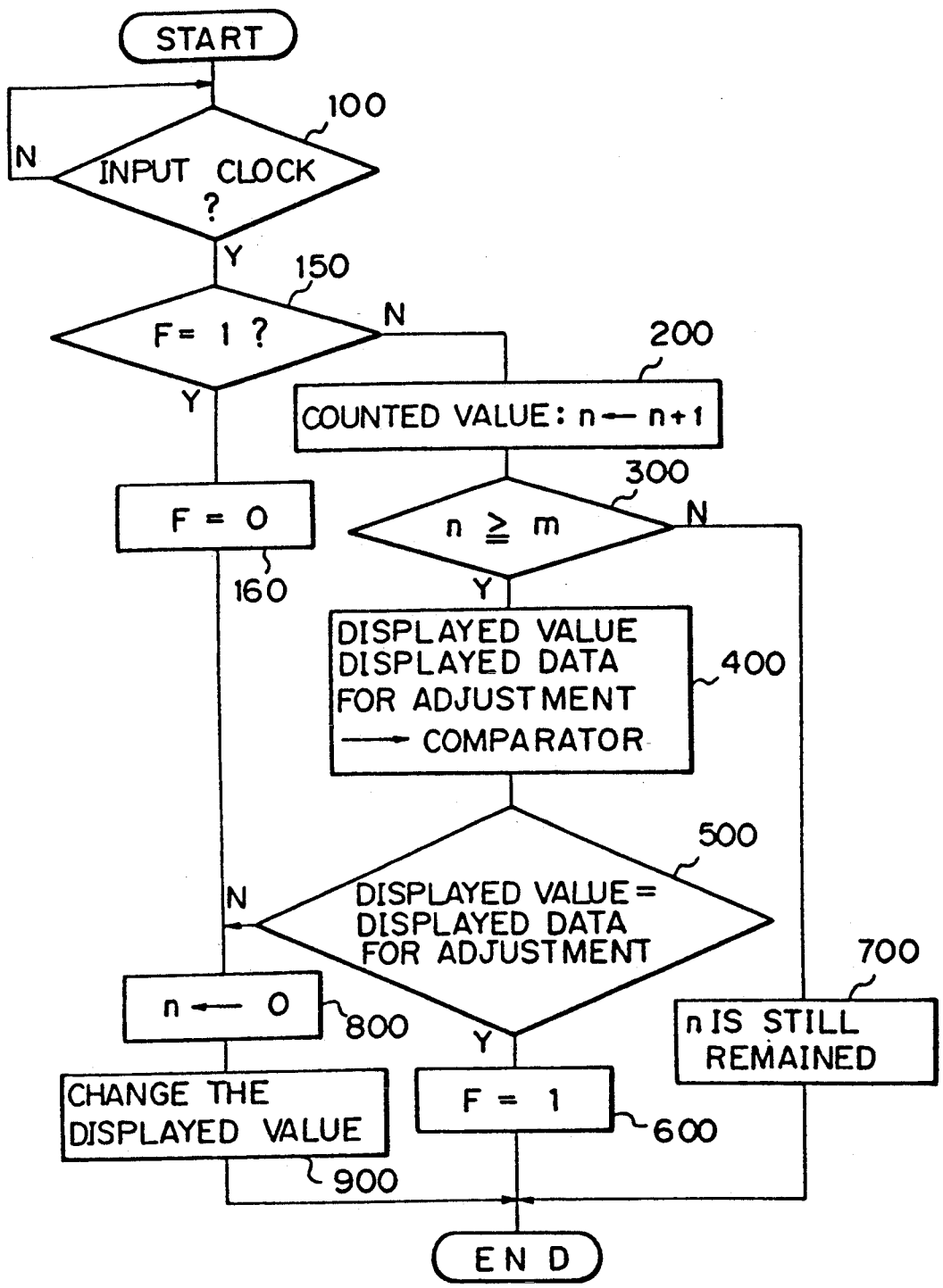
FIG. 4 is a flow chart of a program for changing the display value used in this invention.

FIG. 4 shows the processing in the program for changing the current displayed value.

At step 100, it is discriminated whether a pulse generated by a reference pulse generator 1 is input in this system. In other words, if a clock pulse is recognized, the answer to the question shown in the diamond representing step 100 is "Yes," and the program proceeds to step 150. If a clock signal exists, the answer to step 100 is "No," and step 100 is repeated. Each time a pulse is input, steps 150 on are executed.

At step 150, it is determined whether a flag F indicating the timing for carrying out the adjustment is ON or not. When F=0 at step 150 (flag is OFF), the process goes to step 200.

As step 200, data of a count n of the clock pulses stored in the RAM 8 is transferred to an incrementor 10 through an internal bus. The count is incremented by 1, and the value n+1 is set as a new count N.

At step 300, this n is transferred to a comparator 11. A count m (in this case, m is 1025), previously stored in the data ROM 9 as an approximate pulse number, is also transferred to the comparator 11. The value n and m are compared.

If the value n reaches the value m (n≧m), the process goes to step 400. If the value n has not yet reached the value m, the process goes to step 700 and the instant value n is returned to the RAM 8 and stored therein.

At step 400, the current displayed value indicated in units of miles stored in the EEPORM 7 is transferred to the comparator 11, while the table indicating the timing at which the adjustment of the clock should be carried out and stored in the data ROM 9, is transferred to the comparator 11.

At step 500, utilizing the table, it is determined whether the values of each digit of a display data to be adjusted and the current mile displayed value coincide. When they coincide (that is, adjustment should be carried out), the process goes to step 600. If not, the process goes to step 800.

At step 600, a flag F indicating the adjustment is ON, i.e., F=1. If F=1, when the next pulse is input, the process goes to step 160 through step 150, whereby the flag F is turned OFF (F=0) and the process goes directly to step 800 without going through steps from 200 to 500.

In accordance with this process, the adjustment of this invention is carried out and the current displayed value is changed after an extra 1 pulse is counted.

At step 800, the count n stored in the RAM 8 is reset to zero, i.e., the number n is cleared. At the following step 900, the displayed value in the EEPROM 7 is incremented by 1.

After steps 600, 700, and 900, the process goes to the next routine.

According to the process as mentioned above, referring to the 10 digit place, for example, the display value is changed along with addresses C, D, E, F, and G in the 10 mile digits of FIG. 3 as 19 miles→20 miles, 39 miles→40 miles, 59 miles→60 miles, 79 miles→80 miles, and 99 miles→100 miles. In actuality, the change is made after the automobile runs 1026 pulses instead of 1025 pulses.

Figure 5:
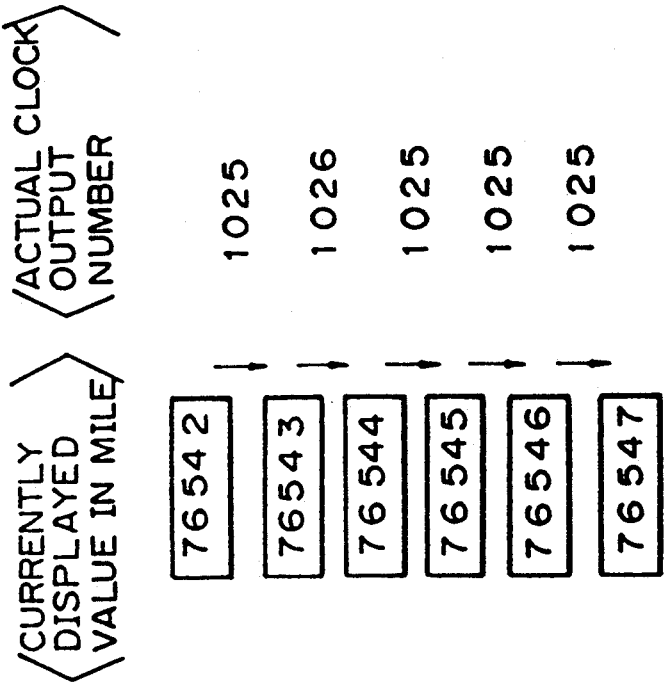
FIGS. 5 and 6 are charts illustrating examples for switching the display value and relationships between each switching operation and the actual number of the output pulses.
Figure 6:
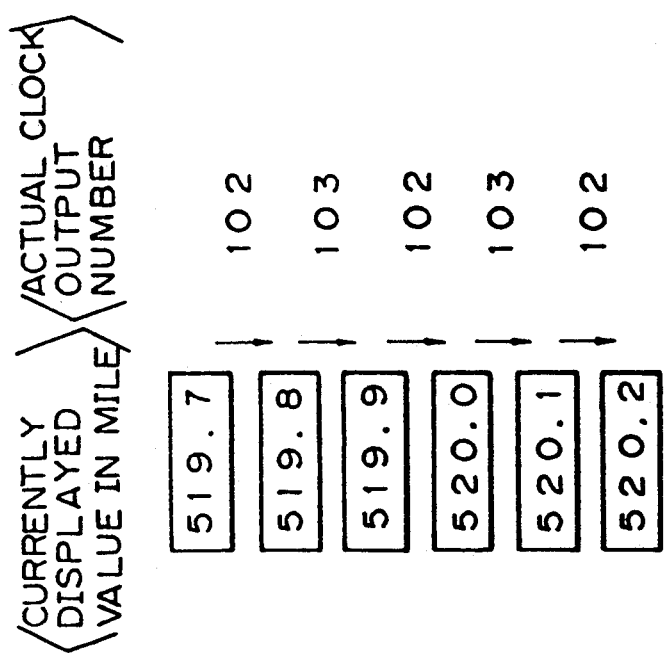
Figure 7:
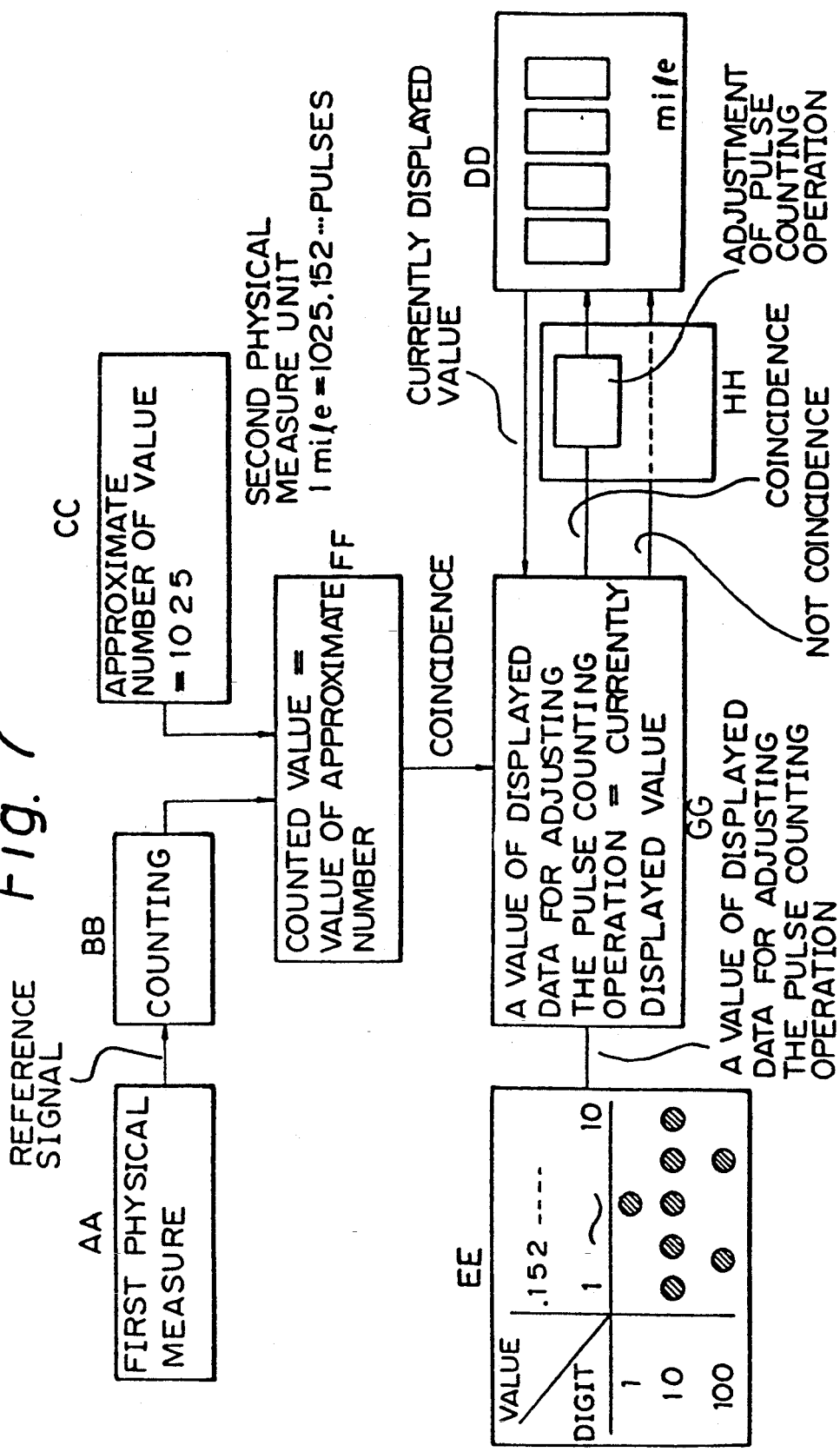
FIG. 7 is a block diagram of a device for displaying a physical measure of this invention.
Figure 9A:
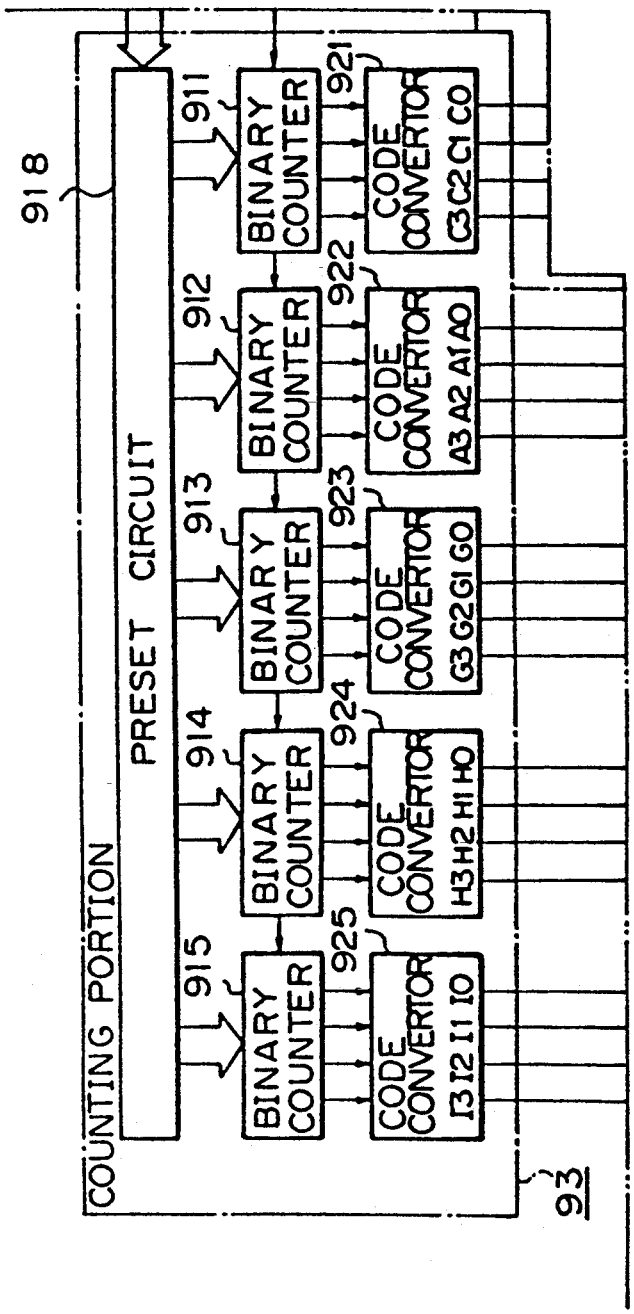
Figure 9B:
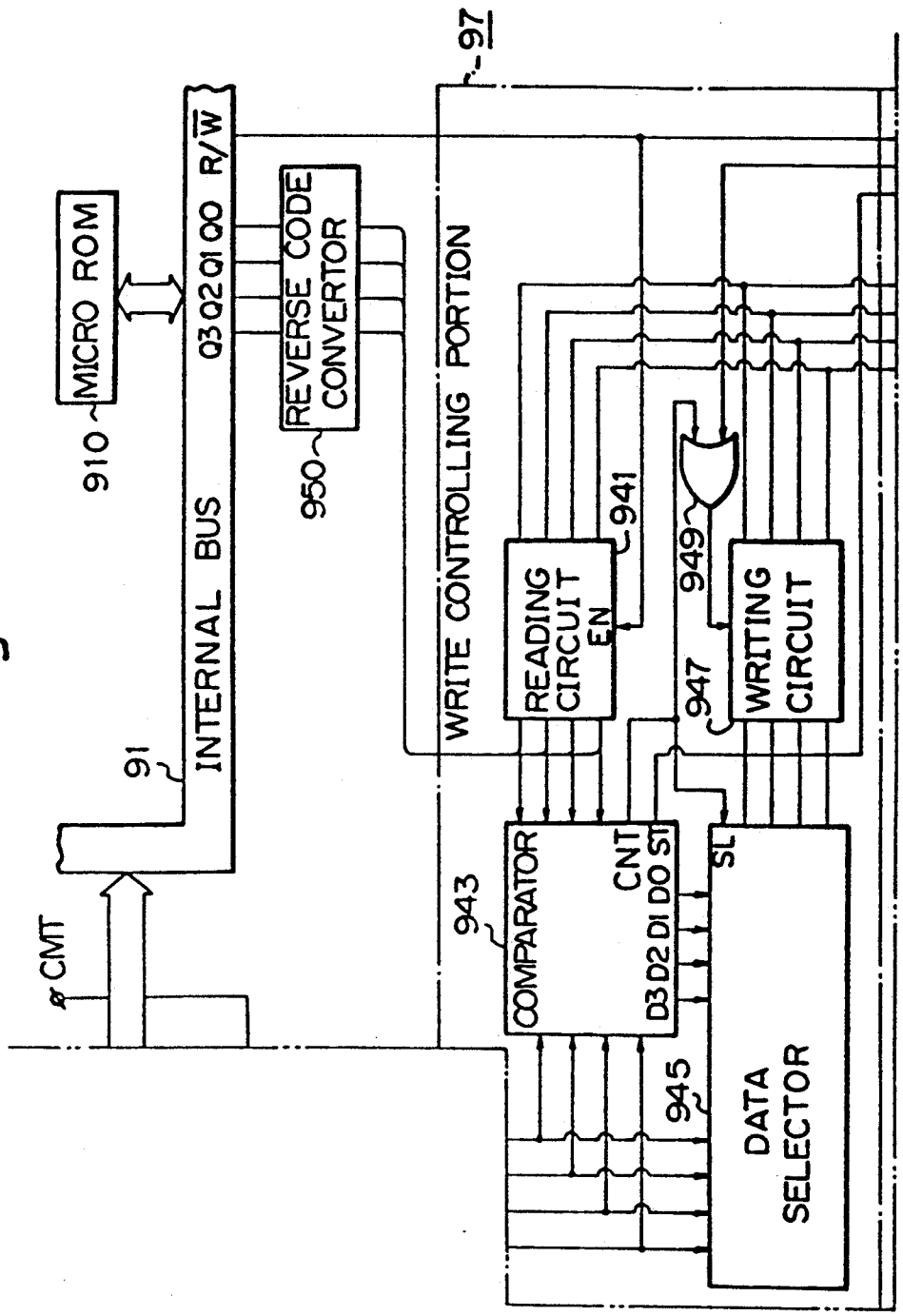
Figure 9D:
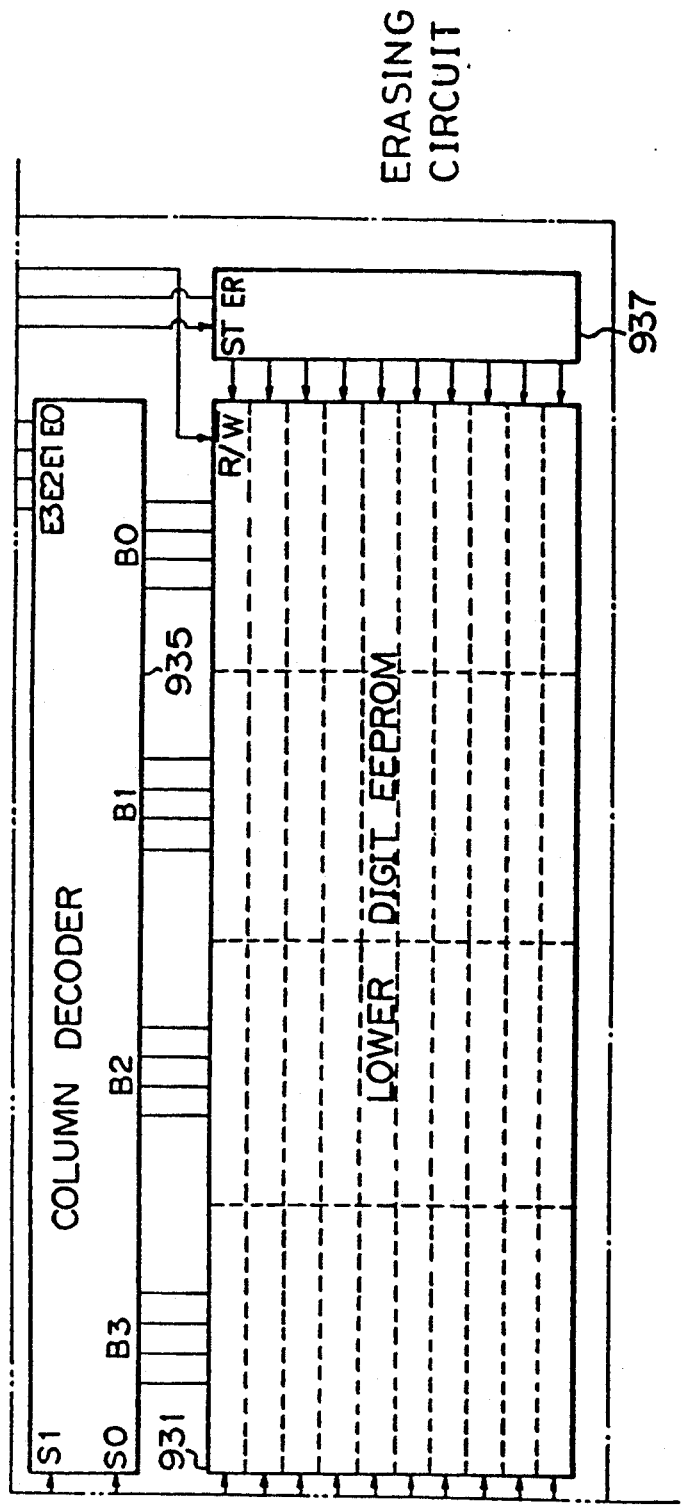

FIGS. 5 and 6 show the relationship between the change of the display by the display device 4 in the passenger compartment and the actual number of pulses output from the reference pulse generator 1.

FIG. 5 shows the case in which the lowest unit of the display is one-tenth of a mile, while FIG. 6 shows the case in which the lowest unit is one mile.

According to this invention, the display of miles can be realized with a high accuracy by just switching a switching device. In this embodiment, further, the adjustment can be realized by amending the control program of the μROM 5 and slightly increasing the capacity of the memory devices, so production costs are almost the same as in the prior art where no adjustment is performed.

Another embodiment of this invention will be explained below. This embodiment is characterized by the method for storing the display data to be adjusted in the data ROM 9. The constituent elements, circuits, etc. are the same as those in the previous embodiment, so an explanation thereof will be omitted.

In this embodiment, a reference pulse generator 1 which generates exactly 2548 pulses per kilometer and 4100.608512 pulses per mile is used. Further, in the approximate number of pulses is set at 4100, and adjustment is carried for three digits following the lowest digit of the approximate number of pulses (i.e., 0.608).

Note, for example, the display data to be adjusted stored at the address P in FIG. 8. When the current displayed value on the display device 4 changes from 299.9 to 300.0, the comparator 11 determines at step 500 that the two values (display value and display data) coincide. This timing corresponds to when the lowest digit of the current displayed value changes from 9 to 10 (0).

In this situation, in FIG. 8, suppose a display data to be adjusted, is stored in one or more the addresses $S_1$, $S_2$, and $S_3$ where the values of the digits (0.1, 1, and 10) of the digits of a display data to be adjusted other than the highest digit (100) change from 9 to 10 (0). In this case, at least 2 pulses are simultaneously adjusted at the timing when 299.9 changes to 300.0.

Therefore, in this embodiment, display data to be adjusted are not stored in the addresses $S_1$, $S_2$, and $S_3$ as shown in FIG. 8, so 2 or more pulses are never simultaneously adjusted.

It is preferable that the error between the actual running distance of an automobile and the distance obtained by counting pulses fall within one pulse. The adjustment of two or more pulses simultaneously is a problem because of causes more than one pulse worth of error. In this embodiment, however, 2 or more pulses are never simultaneously adjusted, so the error is always kept within one pulse and thus the accuracy can be improved.

This invention is effective when the display data to be adjusted, is not stored in addresses where the value of the 0.1 digit of the lowest digit of the display data to be adjusted, changes from 9 to 10 (0). The timing at which the comparator 11 determines coincidence is the same for predetermined values even other than the timing where the value when the lowest digit of the current displayed value changes from 9 to 10 (0).

In these embodiments, the adjustment is made by adding a predetermined number of pulses, for example, one pulse, to the approximate number of pulses at a suitable timing and at a suitable frequency, but when the approximate number of pulses is set in a different way, the adjustment may be made by subtracting predetermined number of pulses.

In this invention, a second physical measure and a third physical measure may be displayed simultaneously or one of them may be selectively displayed by a suitable switching means. In that case, the second physical measure need not be a whole multiple of the pulses and the third physical measure may be whole multiple.

For example, the second physical measure and the third physical measure may be displayed in units of miles and kilometers respectively.

This invention is not restricted to only digital electronic odometers for automobile and can also be applied to any usage in which the physical measure is obtained by counting pulses of a predetermined interval and the physical measure to be counted is not whole multiple of counted pulses.

Accordingly, in this invention, time, weight, or the like are included as the first physical measure in addition to distance.

Another application of this invention is for a stage moved by a pulse motor. If the moving distance of the stage is not a whole multiple of the pulse or pulse interval, the distance can easily be obtained utilising the present invention.

The invention is also useful when changing the tire diameter of an automobile.

That is, when an automobile tire is changed from a standard size to a different size, the number of pulses corresponding to 1 kilometer will no longer be integral. This can be dealt with by the measuring system of the present invention.

Further, if the display value to be adjusted is stored in an externally rewritable semiconductor memory device, for example, an EEPROM, the contents of the memory can be rewritten so as to deal with such a case effectively when it occurs.

Another application of this invention is to quarantee the accuracy of the oscillator such as a crystal used for a watch or the like or to change the oscillator to one having a different oscillating frequency.

Below, an explanation will be made of a counter in accordance with this invention and useful as a counter for a physical measure display device, particularly a counter having non-volatile characteristics, and a coding system used for the same.

In a display device such as one of the present invention, a tremendous amount of calculations are always performed and therefore a large number of memories must be provided. The size of the device thus becomes large and the production costs thereof increase. Further, there is an adverse effect on accuracy. In the prior art, when the same data processing as in this invention is carried out, the accuracy of the measuring system has been kept at a certain level by restricting the number of memories even at the expense of some accuracy.

The embodiment of the present invention explained below improves on the drawbacks of the prior art and, while restricting the number of memories, uses a non-volatile counter which can improve the performance of data processing of the memory as a whole and a coding system used for the same.

The non-volatile counter of this embodiment is one which updates data stored in erasable and writable non-volatile memory devices based on the count and performs a counting operation. The non-volatile memory devices are arranged as an array of cells of a predetermined number of bits.

The non-volatile memory devices are provided with a selecting means for selecting a cell corresponding to the value of the predetermined digit of the count from the cell array and a writing means for writing data corresponding to the value of a digit different from the predetermined digit in the selected cell.

This preferred embodiment of the non-volatile counter of the present invention will be explained below.

FIGS. 9A, 9B, 9C and 9D collectively show a schematic view of the non-volatile counter of this embodiment.

The non-volatile counter is constructed as a one-chip semiconductor device. As shown in FIGS. 9A, 9B, 9C, and 9D, it operates based upon a read-write controlling signal R/W received through an internal bus line 91 or a control signal, such as a counting signal CNT, directly received from an externally provided vehicle speed sensor (not shown).

This non-volatile counter is also provided with a counting unit 93 for performing the counting operation due to the counting signal CNT received from the vehicle speed sensor, a lower digit control unit 95 which can access a lower digit EEPROM, a write control unit 97 for controlling writing to the lower digit EEPROM, and a higher digit control portion 99 which can access the higher digit EEPROM.

Connected to the internal bus 91 is a μROM 910 which stores therein, a micro code for carrying out a predetermined process, such as an initializing process actuated by the power-on reset circuit (not shown).

The counting unit 93 is provided with five 4 bit binary counters 911, 912, 913, 914, and 915 for 5 digits, a preset circuit 918 for presetting the binary counters 911 to 915, and code converters 921, 922, 923, 924, and 925 for converting 4 bits of output from the binary counters 911 and 915.

The carrier signals of the binary counters 911 to 914 are input to the successive counters 912 to 915. Overall, five digits in a binary coded decimal code, i.e., up to 99999 pulses, are counted.

The preset circuit 918, when power is supplied to the non-volatile counter, reads out the count stored in the chip and presets this value in the bits of the counters 911 to 915.

The preset circuit 918 can work as firmware along with the μROM 910. The operation for reading out the count stored inside the chip can be processed in accordance with the processing routine stored in the μROM 910. Each of code converters 921-925 converts a binary number inputted from its corresponding counter, one of 911-915, to a code; each converter accepts a 4-bit binary number and outputs a 4-bit code.

The input/output relationship for each of the converters is illustrated by the chart in FIG. 10A. Thus, for example, suppose an inputted binary number to converter 921 is 0011, which is equal to decimal number 3, by looking at the row labelled 3 in the column under heading "decimal," it can be seen that the output code of converter 921 is 0111. FIG. 10A thus defines the input/output relationship for each of converters 921-925.

Note that if desired, each of converters 921-925 may be designed to follow the input/output relationship different from one shown in FIG. 10A. An alternative input/output relationship that converters 921-925 may follow for the present application is shown in FIG. 10B.

Each of converters 921-925 may be implemented by combination of AND- and OR-gates. Alternatively, they can be implemented using a programmable logic array (PLA), but in this embodiment, the device is realized by just forming the required gate circuits in the chip.

The outputs C3, C2, C1, and C0 of the code convertor 921 are input to the writing control unit 97. The outputs A3, A2, A1, and A0 of the code convertor 922 and the outputs G3, G2, G1, and G0 of the code convertor 923 are input to the lower digit control unit 95. The outputs G3, G2, G1, and G0, the outputs H3, H2, H1, and H0, and the outputs I3, I2, I1, and I0 of the code converters 923 to 925, respectively, are input to the higher digit control unit 99.

The lower digit control unit 95 comprises a lower digit EEPROM 931, a row decoder 933 for setting a row address of this EEPROM 931, a column decoder 935 for selecting four bits out of each word of the EEPROM 931, an erasing circuit 937 which erases the EEPROM in word units, and a selecting signal generating circuit 939 for controlling the selection in the column decoder 935.

The EEPROM 931 has a 1-word 16-bit construction. One of the words is selected by the row decoder 933.

The inside of a word is separated into four portions of cells consisting of four bits each. Each cell corresponds to one digit of a decimal number.

The four bits B0, B1, B2, and B3 corresponding to a row in the cells are selected by the column decoder 935. Accordingly, the cell selected by the column decoder 935 of a row address selected by the row decoder 933 is the object of the writing or reading.

Figure 11:
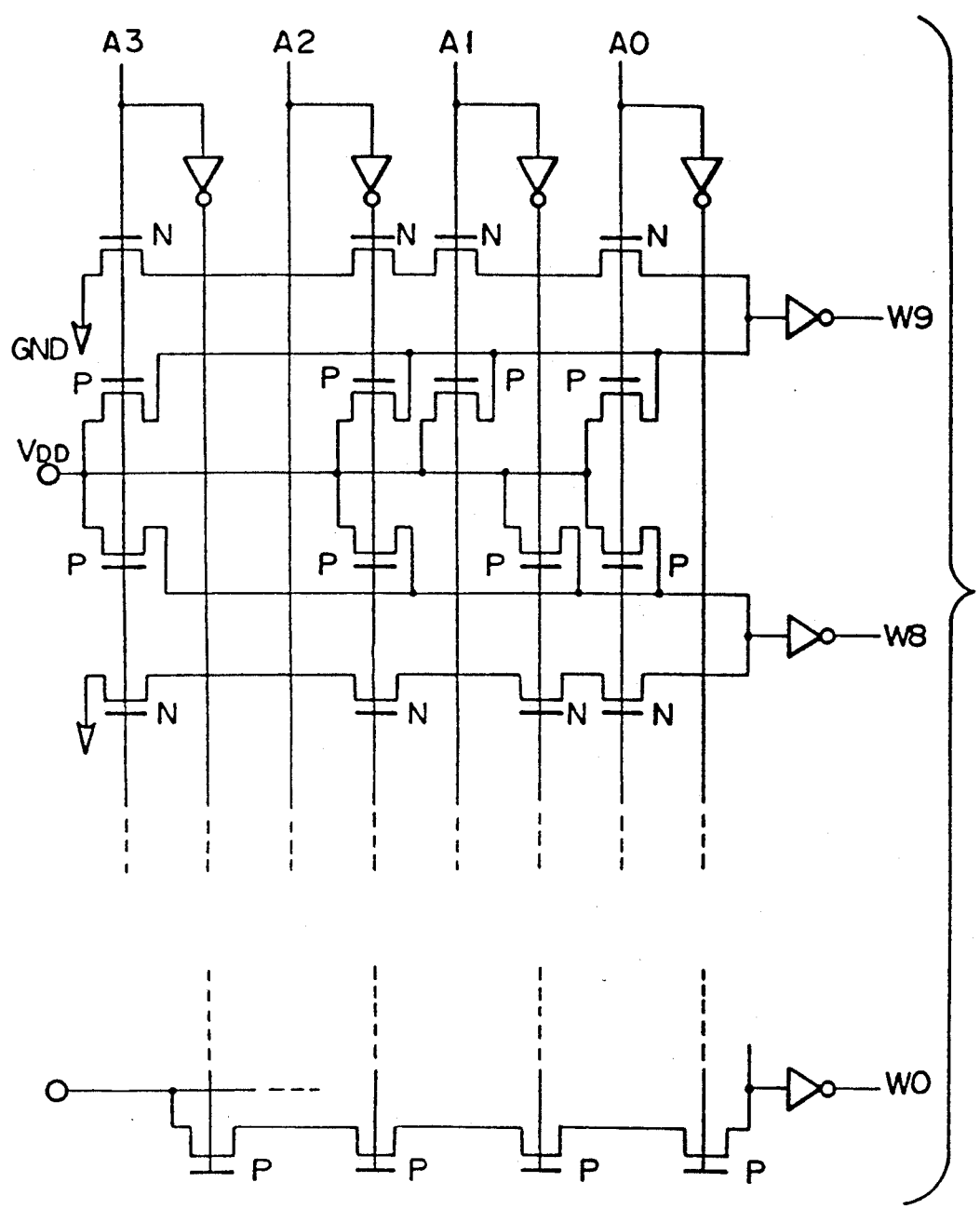
FIG. 11 is one embodiment of a circuit for a row-decoder used in the non-volatile memory counter shown in FIG. 9.

The row decoder 933 of the lower digit control unit 95 is constructed by forming n-type and p-type FETs, corresponding to the necessary code, between the positive signal lines and the negative signal lines of the output data A3 to A0 of the code convertor 922 and the ground line GND and power line VDD, as shown in FIG. 11.

Therefore, for example, when the output data A3 to A0 of the code converter 922 is [1011], the word address W9 is selected. FIG. 10A shows a count code of [1111] which represents the number 10 in the decimal system, but this is never used as output data of the code converter 922 or the like. This code is only used as an index which shows the writing operation to the cell has been completed.

The column decoder 935 is provided with an analog switch (not shown) for selecting data and a sense amplifier for reading out data. It activates one of the 4 bits from B0 to B3 corresponding to each cell.

Therefore, the writing data output from the writing control unit 97 is supplied to the cell selected by the EEPROM 931, or the data read out from the cell selected by the EEPROM 931 is output to the writing control unit 97. Each cell stores $10^3$ values. The method for holding numbers in the EEPROM 931 will be explained later.

The selecting signal generating circuit 939, which outputs the selecting signals S1 and S0 to the column decoder 935, operates by the output signals G3 to G0 of the code convertor 923. As a result, the bits B0 to B3 are selected cyclically with every 100 counted by the counting unit 93. The selecting method will be explained later.

The erasing circuit 937 of the lower digit control unit 95 erases whole words of the lower digit EEPROM 931 at one time. It is a well known circuit in which electrons are injected in a floating memory gate in the EEPROM 931.

The writing control unit 97 comprises a reading circuit 941 for reading and latching data E3, E2, E1, and E0 from the lower digit control unit 95 through the column decoder 935, a comparator 943 for comparing the data E3 to E0 latched in the reading circuit 941 and the output data C3 to C0 output from the code converter 921 provided in the counting unit 93, a data selector 945 for selecting and outputting one of the groups of output data D3, D2, D1, and D0 of the comparator 943 and counts C3 to C0 of the code converter 921 in the counting unit 93, and a writing circuit 947 for latching the output of the data selector 945 and output the same to the column decoder 935 of the lower digit control unit 95.

The comparator 943 activates the control signal CMP when the data E3 to E0 and data C3 to C0 coincides in all but one bit. When the data differ in 2 or more bits, the comparator 943 activates the erasing signal ST and outputs the data D3 to D0 taking the exclusive OR of the data.

The control signal CMP of the comparator 943 is connected to a selecting terminal SL of the data selector 945 and is input to an enable terminal of the writing circuit 974 through the two-input OR gate 949.

As a result, when the comparator 943 determines that the two data coincide in all but one bit, the data selector 945 outputs the exclusive OR data D3 to D0. Otherwise, it outputs the output data C3 to C0 of the code convertor 923.

On the other hand, the erasing signal ST of the comparator 943 is input to the erasing circuit 937 of the lower digit control unit 95. The erasing completion signal ER output from the erasing circuit 937, which erases words existing in the lower digit EEPROM 931 in response to the erasing signal ST, is input to the other input terminal of the OR gate 949.

The output of the reading circuit 941 is connected to the internal bus 91 through a code reconvertor 950 which converts the code into an ordinary binary code, so other devices, for example, a $\mu$ROM 91, connected to the internal bus can read out the data stored in the EEPROM 931 in units of cells through the internal bus by making the reading and writing control signal R/W output from the internal bus "high active".

The data writing operation of the writing control unit 97 will be explained hereunder.

(1) A cell to which data is to be written is selected in accordance with a predetermined routine in the $\mu$ROM 910, and the data stored in the cell is read out. The data is then latched to the reading circuit 941 through the column decoder 935.

(2) The data E3 to E0 latched to the reading circuit 941 is compared with the data C3 to C0 of the lowest digit of the current count by the comparator 943. At the same time, the comparator 943 outputs the data D3 to D0, which is the exclusive OR of the two data. As code converters 921-925 output codes, numbers are written into EEPROM 931. What is exactly being written into a cell within EEPROM 931 is shown by the chart in FIG. 10A. Thus, for example, if the output code of converter 921 is 0111 (see the row associated with entry "3" under the column heading "decimal"), then what will be written into a particular cell in EEPROM is 0100 (see the same row, under the column heading "ERASING AND WRITING").

The numbers entered under the column heading "ERASING AND WRITING" can be derived as follows. Suppose that an inputted code from code converter 921 is 0111. This code is EXCLUSIVE-ORed with previously inputted code, which is 0011. EXCLUSIVE-OR of 0011 and 0111 is 0100. Thus, 0100 is entered under "ERASING AND WRITING" column at the row corresponding to code 0111 (which also corresponds to decimal number 3).

The entries under "ERASING AND WRITING" show what bits in a cell within EEPROM 931 will be overwritten. Thus, for the previous example, when the entry was 0100, only the second bit (value of 1) will be changed in the cell within EEPROM 931 when code 0111 is generated. Other bits are untouched.

When a generated code and its previously generated code differ in one bit position, comparator 943 activates control signal CMT. This in turn, allows data selector 945 to choose data D3 through D0 of comparator 943 as its output. The output of writing circuit 947 is enabled through OR gate 949. Thus, when a generated code and its previously generated code differ in one bit position, the output of comparator 943 is written into a particular cell from which data was previously read out.

(3) There are instances when a generated code and its previously generated code differ in more than one bit position. As an example, see code entry 0100 and its previous code entry 0111. It is clear that EXCLUSIVE-ORing them yields 0011, which indicates that codes 0100 and 0111 differ in two bit positions (at the first and the second bit positions). In this instance, all four bits in the particular cell in EEPROM 931 are first set to 0000. Next, as shown in the entry under "ERASING AND WRITING" at the row with code 0100, 0100 is written into the cell.

When two or more bits in a code and its previous code differ in 2 or more bit positions, signal ST from comparator 943 is activated. Erasing circuit 937 then erases the whole word (sixteen bits) containing the cell from which data was previously read out. When the whole word is completely erased, erasing completion signal ER from erasing circuit 937 is activated, whereby the output of writing circuit 947 is enabled.

It is noted that signal CMT is not activated at this time, so that data selector 945 selects and outputs data C3 through C0 from code converter 921.

In other words, when a code and its previous code differ in more than 1 bit position, data C3 through C0 from code converter 921 are written into a predetermined cell of EEPROM 931 by writing circuit 947.

When the whole word is completely erased, the erasing completion signal ER of the erasing circuit 937 is activated, whereby the output of the writing circuit 945 is enabled.

At this time, the control signal CMP of the comparator 943 is not activated, so the data selector 945 selects and outputs the output data C3 to C0 of the code converter 921.

Accordingly, when the two data differ in 2 or more bits, the output data C3 to C0 of the code converter 921 are written into a predetermined cell of the lower digit EEPROM 931 by the writing circuit 947.

For example, when the current data in a cell is [0111], the next counted code would be [0100], since the data differ in two or more bits, the output data [0100] of the code convertor 921 is selected and written into the cell after the EEPROM 931 is erased.

The higher digit control unit 99 comprises a higher digit EEPROM 951, a higher digit data erasing and writing circuit 953 for erasing and writing data in the higher digit EEPROM 951, and a reading circuit 955 for reading the data from the higher digit EEPROM 951.

The higher digit control unit 99 consists of a conventional circuit in which both data erasing and writing are carried out each time, because data rewriting is not carried out so frequently with the higher digits, as with the lower digits.

The operation of the non-volatile counter used in this embodiment will be explained hereunder.

Figure 12:
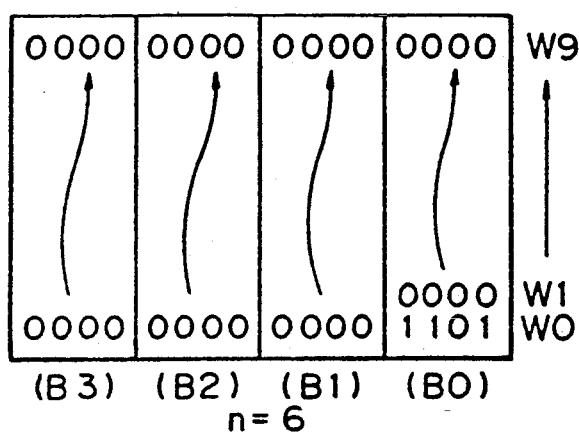
FIGS. 12A, 12B, 13, and 14 are charts illustrating the embodiments used with the coding system in the counter shown in FIGS. 10(A) and 10(B).
Figure 12:
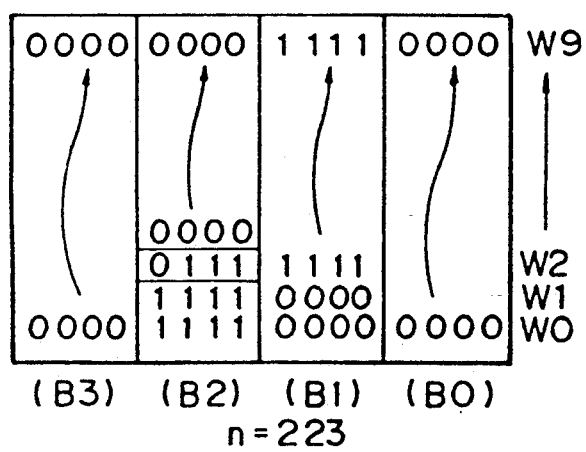

When the counter is first used, i.e., the count is started from zero, the word address W0 and bit B0 are selected as shown in FIG. 12(A).

Every time a counting signal CNT is input to the counting unit 93 from an external portion, the counting operation is carried out and the output of the lowest digit code convertor 921, is changed along with the count code shown in FIGS. 10A and 10B.

In response to this, the writing operation, or the erasing operation prior to the writing operation and the writing operation, is carried out in the cell (W0, B0) of the lower digit EEPROM 931 by the writing control unit 97. In this step, as shown in FIGS. 10A and 10B, only one bit out of four of data is written in the cell.

FIG. 12(A) shows diagrammatically the state of the lower digit EEPROM 931 when the value 6 is written.

Regarding the counted code, as shown in FIGS. 10A and 10B, the data after the counting often comprises the data in which a part of the bits thereof and not being written before the counting is written. Further, this relationship of before and after the count code continues two or three times. Therefore, while this relationship continues, no erasing of the data of the digit is required, and data may be written successively.

When the counting operation thus proceeds to the value 10 (decimal), the output of the code convertor 922 of the counting unit 93 is incremented. Then, after the data of [1111] is written in the cell (W0, B0) in which the data has been written heretofore, the word address W1 is selected as the next cell and the data of [0001] is written in the cell thus selected.

As the counting operation proceeds, the word address is successively incremented toward the address W9. At the same time, each cell of the bit B0 is successively filled with data [1111].

When the counting operation further proceeds and the value exceeds 100 in decimal figures, the output of the code convertor 922 is returned to its initial condition while the output of the higher code convertor 923 is incremented. At this time, the column decoder 935 selects the bit B1 by the output from the selecting signal generating circuit 939 in the lower digit control portion 95.

Accordingly, after that, the written cells are successively switched starting from the cell (W0, B1) for the bit B1 column.

When the data [0111] of the cell (W0, B1) is rewritten to the data [0100], as explained above, the EEPROM 931 is erased in word units. Therefore when a certain cell is erased, the data in the cell belonging to the lower bits of the same word is cleared to [0000].

Consequently, for example, in a situation where the count reaches the value 223 (decimal), as shown in FIG. 12(B), the cell (W2, B2) becomes [0111] and the contents of data of the cells from the cell (W1, B2) just one cell before to a cell (W2, B1) 10 cells before to be written or erased to [1111] and further the contents of data of the cells from the cell (W1, B1) to a cell (W0, B0) are written or erased to [0000].

When the value 224 is counted, the data of the cell (W2, B1) is erased to [0000]. In summary, as a counting operation proceeds, a cell within EEPROM 931 is designated by proper select lines and it is being written to. In the example shown in FIG. 12A, number 6 (whose code equivalent is 1101) is being written to a cell at row and column location (W0, B0). As code converter 921 continues to generate codes, this particular cell location will be written to, in accordance with codes as shown in FIG. 10A. For example, code converter 921 will generate, after it has generated code equivalent to decimal number 6, code 1000 (which corresponds to decimal number 7). This will be written into the cell (W0, B0). As the counting procedure continues, new codes will be generated, and each code will be written to cell (W0, B0). It may be noted, as explained previously, when two codes generated consecutively by the same code converter differ in more than 1 bit position, the whole word W0 [containing cell (W0, B0)] will be erased prior to writing proper data into (W0, B0) in accordance with FIG. 10A.

The counting procedure will continue until cell (W0, B0) is filled with 1111. Then, at the arrival of next pulse, cell (W0, B0) is no longer selected, and the writing procedure will continue to be performed, but at new cell (W1, B0). Codes will continue to be written into cell (W1, B0) until this particular cell becomes filled with 1111. This will cause the next cell (W2, B0) to be selected.

Each time a cell becomes filled with 1111, another cell just above the cell filled with 1111 will be selected. This in turn will be filled with 1111. As counting procedure continues, the column of cells filled with 1111 grows until the whole column is filled with 1111's. When the column is filled, then, the next column is selected, and the cells therein are filled with 1111's.

Note, when writing to a cell, for codes 0100 and 1000, that a word is erased before particular bits are written to the cell (see FIG. 10A under column "ERASING AND WRITING" for codes 0100 and 1000). In summary, other cells within the same word, but in columns different from that of the designated cell, are all cleared.

Consecutive decimal numbers are written to a cell until it becomes filled with 1111. In the process, however, other cells within the same word are cleared. Thus, each time a particular cell is filled with 1111, other cells in the same row but in different columns are reset to 0000.

As a stack of 1111's grows upwards in column B0, stacks of 0000's grow in other columns. By the time B0 is filled with all 1111's, other columns are filled with 0000's.

When second column B1 begins to be filled with stacks of 1111's, column B0 will begin to clear from its bottom, up to the particular level of the row being addressed in B1. Suppose that cell (W3, B1) is being written to. Then, all cells in column B0 below W3 will contain 0000. On the other hand, all cells in column B0, above W3 will still be filled with 1111's.

FIG. 12B shows the contents of EEPROM 931 when the counting has proceeded to 223. The particular cell being addressed is (W2, B2). Because the count is over 200, two columns have been written to (notice how column B0 is filled with 0000). Two cells filled with 1111's in column B2 indicate that over twenty has been counted, in addition to 200. The particular cell (W2, B2) contains code 0111, which corresponds to decimal number 3.

When the count further proceeds to the decimal value 400, the data of all cells except the cell (W9, B3) become [0000] and the writing operation of the data is started again from the cell (W0, B0). In this embodiment, the lower digit EEPROM 931 is composed of a two-dimensional array of a total of 40 cells. A 4×10 array was used to reduce the number of writing and erasing operations for each cell. The values held in the cells correspond to the $10^0$ digit of the count, and the word values (from W0 to W9) of the cells correspond to the $10^1$ digit of the count. Accordingly, even in the case of the value 223 shown in FIG. 12(B), the value actually dealt with as the count is the lower two digits (23). The $10^3$ digit up of the count is stored in the higher digit EEPROM 951.

When the count is read, the lower digit EEPROM 931 is scanned from the lowest cell (W0, B0) by the routine stored in the μROM 910 to detect the first cell, after successive [1111] cells, not having the data [0000]. This cell holds the data of the lowest digit $10^0$, while the position of the cell represents the data of the $10^1$ digit.

For example, in the example of FIG. 12(B), the cell concerned is (W2, B2) and therefore the value stored in the cell is 3, as shown in FIG. 10(A), so the count 223 can be easily read without using a special conversion circuit or the like.

Accordingly, the data obtained by adding the data of the lower digit, specified by the bit line and the word line of the cell and the data stored in the cell, to the data stored in the higher digit EEPROM 951 corresponds to the count stored in the non-volatile counter.

If the power is interrupted during the count and then is reinput, the EEPROM lower digit EEPROM 931 is scanned from the lowest cell (W0, B0) by the routine stored in the μROM 910 in the same way as the above read processing to detect the cell holding the data of the lowest digit, read the data of the lower digit, add the data stored in the higher digit EEPROM 951, and set the data by the preset circuit 918. The counting operation after that is the same is the manner previously explained.

As described above, the non-volatile counter of this embodiment specifies the position of the two-dimensionally arrayed cells of the lower digit EEPROM 931 by the data of the $10^1$ digit and writes the data of the lowest digit of the count in the cell.

Therefore, in this invention, the count can easily be stored by an extremely simple construction by having the 40 cells uniformly and repeatedly used.

Further, the numbers of writing operations of the bits in the cells are made leveled out so the number of the erasing and writing operations per cell does not increase geometrically the lower the digit. Consequently, the number of the erasing and writing operations per cell is only several percent that of the lowest digit in a simple, conventional counter construction and the overall reliability and durability can be improved.

Further, according to the non-volatile counter of this embodiment, since the $10^1$ digit of the count is used as information of the position of the cell storing the data, even when error occurs in the bit of the cell on which the final writing operation was carried out or an error occurs in a bit of a separate cell, the count will not be wrong by a large amount.

Figure 13:
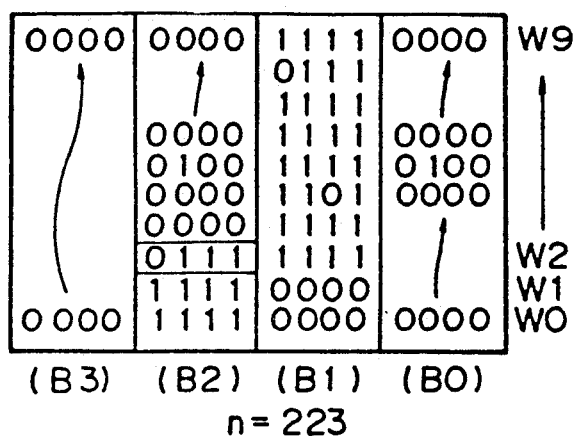

For example, as shown in FIG. 13, even when a bit error occurs in the cells (W5, B0), (W4, B1), (W8, B1), (W5, B2), the last written in cell can be discerned since original data [1111] is stored at least from the cell just before the last written cell to nine cells before the same.

Therefore, the correct data can be reproduced except when a bit error occurs in the last written cell.

On the other hand, even when a bit error occurs in the last written cell, the data is only the value of the $10^0$ digit so the error can be kept to a minimum.

Further, in accordance with this embodiment, the count code shown in FIGS. 10A and 10B is adopted in the lower digits requiring repeated data rewriting the counter, so the number of erasing operations can be lessened and sufficient durability and reliability can be realized even when using an EEPROM limited in terms of the number of erasing and writing operations.

For example, when the values from 0 to 9 are counted, only three erasing operations are carried out if the count code of this embodiment is used. This is very advantageous with respect to the numbers of the erasing operations compared with the case of utilizing the conventional binary code, in which five erasing operations are required.

Further, with the count code of this embodiment, the numbers of writing operations in the bits of the cells are made substantially equal, which is also advantageous in durability.

Further, in the non-volatile counter of this embodiment, since only one bit of data is always written, the power capacity required for writing can be kept to a minimum and the circuits may be made smaller and more integrated.

In an EEPROM, the voltage VT of a memory cell falls in a writing operation, so when the numbers of bits in which "1" is to be written differ, there is a risk of variation in the voltage VT after the writing. However, this problem can be avoided by always writing only one bit of data as in this embodiment, so the reliability of the data stored in the EEPROM after writing can be improved.

In this embodiment, successive count codes differ by only one bit or the data next written becomes active in only one bit, so the written data may be formed in the writing control unit 97 using just the comparator 943 for calculating the exclusive OR and the data selector 943, thus making the overall construction simpler.

As mentioned above, the non-volatile counter of this embodiment is superior in reliability, durability, and integration, so may be preferably used for an automobile odometers and other fields in which such counters have not been practically used in the past.

The embodiment explained above was structured to enable the cell in which the count code is currently being written to be specified by writing the data [1111] in a cell. After it has finished being written with a count code, performed for single cells, and erasing the data [1111] by an erasing operation caused by a writing operation to a cell in a neighboring column (B0 to B4) now. However, by structuring it so that the state of the cell (data) before the initial value of the count code is written to and the state of the cell (data) after the final value of the count code is written differ, the cell to which the count code is currently being written can be discriminated even in the another construction. For example, it is possible to prepare two kinds of data as the count codes, ones where the final values are [0000] and [1111], and perform the writing operation using these alternately. When such a system is used, even when the lower digit EEPROM 931 is made a 1×10 cell array, i.e., a one-dimensional array, the cell to which the count code is currently being written can be discriminated.

Figure 14:
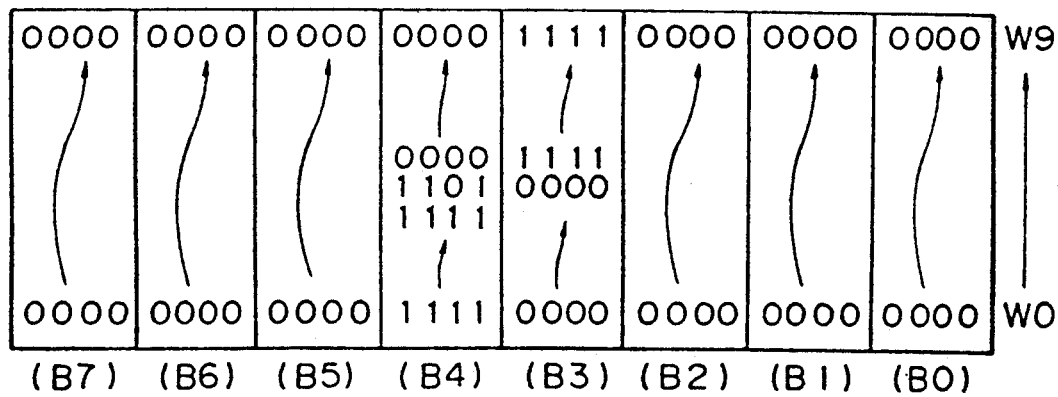

The present invention of course includes many modifications within the scope of the invention, such as ones where the cells are arranged in one-dimensional arrays or three-dimensional or higher arrays, a cell comprises less than four bits or five or more bits, four or more lower digit EEPROM columns (for example, 8 digits as shown in FIG. 14) are used, two bits are simultaneously written in the EEPROM, or a code system other than the system shown in FIGS. 10A and 10B is used.

This invention, as stated above, has the superior effect of a much higher accuracy of display of physical measure without a special increase of the counting capacity and memory capacity.

According to the non-volatile counter used in this invention, cells comprising an array of a predetermined number of bits, constituting a volatile memory, are selected according to the predetermined digits of the count and data corresponding to the value of another digit is written in the cell, so the numbers of the erasing and writing operations per cell can be remarkably reduced the lower digits of the conventional simple counter, so there is the superior effect of an improved reliability of the count to be stored.

Further, each cell the comprising the non-volatile memory carries not only the information of the value of a certain digit which the cell stores but also the information of the value of a predetermined digit by the position of the cell in the array, so the volume of the information stored can be increased over the case where just a plurality of cells is used.

I claim:

1. A non-volatile counter comprising:
   a counter circuit for generating parallel bit codes in response to externally provided count pulses, said parallel bit codes including higher digit bit codes and lower digit bit codes;
   an electrically erasable and writable non-volatile memory for storing at least the lower digit bit codes at a memory cell selected by a lower digit controlling circuit on the basis of said higher digit bit codes, said memory cells being arranged in matrix configuration including a plurality of rows and columns; and
   write controlling means for storing said at least lower digit bit codes in the memory cell selected by said lower digit controlling circuit, said write controlling means including:
     means for reading the contents of a selected memory cell corresponding to a previous lower digit bit code stored therein and comparing said contents to a current lower digit bit code to be written in the selected memory cell;
     means for erasing the contents of said selected memory cell before writing said current lower digit bit code thereto when said previous lower digit bit code differs from said current lower digit bit code at more than one bit position relative to each other, and performing only a single bit write operation otherwise; and
     column designating means coupled to said lower digit controlling circuit for selecting a memory cell associated with a column adjacent to a first column of a previously stored lower digit bit code when a count operation associated with said first column has been completed.

2. The non-volatile counter of claim 1, wherein said erasing means erases all bit positions of all columns associated with the row of the selected memory cell to be erased.

3. The non-volatile counter of claim 1, wherein said counting circuit generates said parallel bit codes based on coding scheme which minimizes the number of times the erasing means must erase the selected memory cell just before a subsequent lower digit bit code, differing by more than one bit position from a previous lower digit bit code, must be written thereto, and before a count operation associated with said selected memory cell has ben completed.

* * * * *